(12) United States Patent
Puckett et al.

(10) Patent No.: US 11,362,480 B2
(45) Date of Patent: Jun. 14, 2022

(54) SELF-INJECTION LOCKED STIMULATED BRILLOUIN SCATTERING LASER

(71) Applicant: Honeywell International Inc., Morris Plains, NJ (US)

(72) Inventors: Matthew Wade Puckett, Phoenix, AZ (US); Karl D. Nelson, Plymouth, MN (US); Jianfeng Wu, Tucson, AZ (US)

(73) Assignee: Honeywell International Inc., Charlotte, NC (US)

( * ) Notice: Subject to any disclaimer, the term of this patent is extended or adjusted under 35 U.S.C. 154(b) by 68 days.

(21) Appl. No.: 16/892,016

(22) Filed: Jun. 3, 2020

(65) Prior Publication Data
US 2021/0384695 A1 Dec. 9, 2021

(51) Int. Cl.
*H01S 3/10* (2006.01)
*H01S 3/108* (2006.01)
*H01S 3/083* (2006.01)
*H01S 3/102* (2006.01)
*H01S 3/30* (2006.01)

(52) U.S. Cl.
CPC ............ *H01S 3/1086* (2013.01); *H01S 3/083* (2013.01); *H01S 3/1022* (2013.01); *H01S 3/302* (2013.01)

(58) Field of Classification Search
CPC .. H01S 3/06791; H01S 3/08027; H01S 3/082; H01S 3/083; H01S 3/30; H01S 3/302; H01S 5/142
See application file for complete search history.

(56) References Cited

U.S. PATENT DOCUMENTS 5,272,717 A 12/1993 Stultz
5,377,211 A 12/1994 Kong et al.
(Continued)

FOREIGN PATENT DOCUMENTS

| CN | 105024273 A | 11/2015 |
| CN | 205193401 U | 4/2016 |
| DE | 102004003750 A1 | 8/2005 |

OTHER PUBLICATIONS

European Patent Office, "Extended European Search Report from EP Application No. 201164725.0", from Foreign Counterpart to U.S. Appl. No. 16/892,016, filed Oct. 1, 2021, pp. 1 through 10, Published: EP.
(Continued)

*Primary Examiner* — Michael Carter
(74) *Attorney, Agent, or Firm* — Fogg & Powers LLC

(57) ABSTRACT

Systems and methods for a self-injection locked SBS laser are provided herein. In certain embodiments, a system includes a pump laser source providing a pump laser; an SBS resonator receiving the pump laser through a first port and scattering some of the pump laser to provide an SBS laser through the first port, wherein a frequency shift of Brillouin scattering within the SBS resonator is an integer multiple of a free-spectral range for the SBS resonator; a filter receiving the pump laser on a first filter port and the SBS laser on a second filter port, wherein the pump laser is output through the second filter port and the SBS laser is output through a drop port; and a pump laser path coupling the output pump laser into the pump laser source, wherein a frequency of the pump laser becomes locked to a resonance frequency of the SBS resonator.

14 Claims, 5 Drawing Sheets

(56) References Cited

U.S. PATENT DOCUMENTS 9,197,032 B2 11/2015 Qiu et al.
2018/0375281 A1* 12/2018 Puckett .................. G02F 1/125

OTHER PUBLICATIONS

Gundavarapu et al. "Sub-Hz Linewidth Photonic-Integrated Brillouin Laser", Feb. 27, 2018, pp. 1 through 11.
Spirin et al. "Single-mode Brillouin fiber laser passively stabilized at resonance frequency with self-injection locked pump laser", Laser Physics Letters 9, No. 5, Mar. 25, 2012, pp. 377 through 380, Astro, Ltd.
European Patent Office, "Communication pursuant to Article 94(3) from EP Application No. 21164725.0", from Foreign Counterpart to U.S. Appl. No. 16/892,016, filed Mar. 4, 2022, pp. 1 through 9, Published: EP.

* cited by examiner

SELF-INJECTION LOCKED STIMULATED BRILLOUIN SCATTERING LASER

STATEMENT REGARDING FEDERALLY SPONSORED RESEARCH OR DEVELOPMENT

This invention was made with Government support under N66001-16-C-4017 awarded by SPAWAR Systems Center Pacific. The Government has certain rights in the invention.

BACKGROUND

Stimulated Brillouin scattering (SBS) lasers may be used in a wide range of sensing and metrology applications. For example, SBS lasers may provide narrow linewidth optical emissions within small integrated photonics packages. Typically, to stimulate the Brillouin scattering, an external pump laser source (a laser source outside of an integrated photonics package) may provide a pump laser to a Brillouin cavity. To align the frequency of the pump laser with the resonance frequency of the Brillouin cavity, systems may include feedback loops, such as Pound-Drever-Hall (PDH) loops. The PDH loops typically include a phase modulator, detector, mixer, and proportional-integral-derivative (PID) controller. Frequently, at least some of the components of the PDH loop are fabricated outside of the integrated photonics package.

SUMMARY

Systems and methods for a self-injection locked stimulated Brillouin scattering laser are provided herein. In certain embodiments, a system includes a pump laser source that provides a pump laser. The system further includes a stimulated Brillouin scattering (SBS) resonator that receives the pump laser through a first port, wherein the SBS resonator scatters a portion of the pump laser to provide an SBS laser through the first port, and wherein a frequency shift of Brillouin scattering within the SBS resonator is an integer multiple of a free-spectral range for the SBS resonator. Also, the system includes a filter that receives the pump laser on a first filter port and the SBS laser on a second filter port, wherein the pump laser is output through the second filter port and the SBS laser is output through a drop port. Additionally, the system includes a pump laser path that couples the output pump laser from the SBS resonator into the pump laser source, wherein a frequency of the pump laser becomes locked to a frequency of the output pump laser at a resonance frequency of the SBS resonator.

DRAWINGS

Understanding that the drawings depict only some embodiments and are not therefore to be considered limiting in scope, the exemplary embodiments will be described with additional specificity and detail using the accompanying drawings, in which.

In accordance with common practice, the various described features are not drawn to scale but are drawn to emphasize specific features relevant to the example embodiments.

DETAILED DESCRIPTION

In the following detailed description, reference is made to the accompanying drawings that form a part hereof, and in which is shown by way of illustration specific illustrative embodiments. However, it is to be understood that other embodiments may be utilized and that logical, mechanical, and electrical changes may be made.

Embodiments described herein provide for a self-injection locked stimulated Brillouin scattering (SBS) laser. In particular, an electrically pumped gain medium may be placed in the same external optical cavity as the associated Brillouin gain resonator. Using the self-injection locking effect, the resonance frequency of the Brillouin gain resonator may control the frequency of the emitted pump laser beam generated by the electrically pumped gain medium. Thus, the optical pump beam for stimulating the Brillouin laser may automatically align itself with the appropriate resonance frequency of the Brillouin resonator.

In embodiments using the self-injection locked SBS laser, the components of the SBS laser may be fabricated as a single integrated photonics device. For instance, as the SBS resonator automatically controls the frequency of the emitted pump laser to be at a resonance frequency of the SBS resonator, the self-injection locked SBS laser may be fabricated without control loops (such as the Pound-Drever-Hall (PDH) loop). By eliminating bulky and complex control loops, the SBS laser may be implemented on a single photonics chip. As the SBS laser can be made on a single chip, the SBS laser may be cheaper and less complex to manufacture.

Figure 1A:
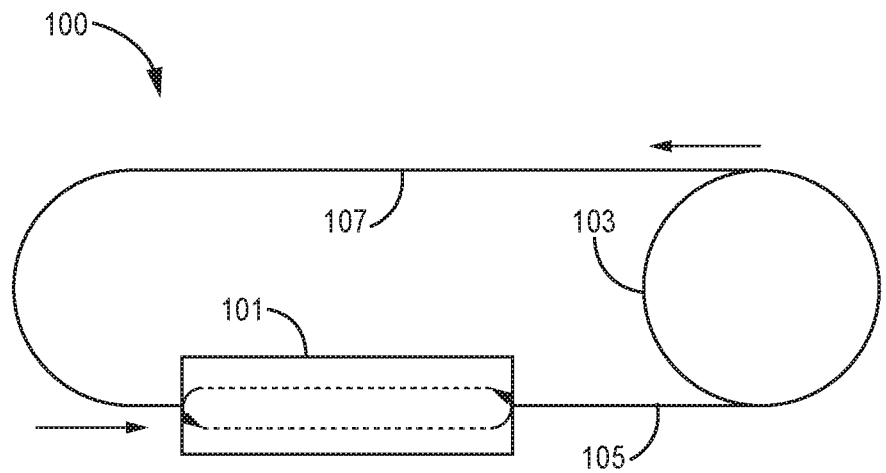
FIG. 1A is a diagram illustrating a system for injection locking a frequency of a laser using a resonator according to an aspect of the present disclosure.

FIG. 1A is a diagram illustrating a system 100 for injection locking a frequency of a laser (referred to interchangeably herein as a laser beam, optical beam, light beam, laser light, light, and the like) produced by a laser source 101 (such as a pump laser source) using a laser fed back from a resonator 103 (such as an SBS resonator, described in greater detail below). As shown, the system 100 includes a laser source 101. The laser source 101 may be capable of producing a laser at a particular frequency. For example, the laser source 101 may be an electronic gain medium, a distributed feedback (DFB) semiconductor laser or other type of laser source. While the laser sources described herein are capable of being fabricated within an integrated photonics chip, the laser source 101 may also include other laser sources that may be coupled to a separately located resonator 103 using fiber optics, optical waveguides, or other transmissive media.

In some embodiments, the laser source 101 may be coupled through an optical path 105 to the resonator 103. As used herein, the resonator 103 may any device through which light may resonate. For example, the resonator 103 may be a fiber optic coil, a series of mirrors, and the like. When the resonator 103 receives the laser from the laser source 101, a portion of the received laser may resonate within the resonator 103 at a resonance frequency, where the resonance frequency is dependent upon the length of the fiber within the resonator 103. Further, the resonator 103 may provide an output laser at the resonance frequency from an output that is coupled through the optical path 107 to an input of the laser source 101. Alternatively, the output laser from the resonator 103 may be reflected back into the resonator 103 and through the laser source 101, where the output may again be reflected to the input of the laser source 101.

In certain embodiments, the output laser provided by the resonator 103 to the laser source 101 through the optical path 107 may injection lock the laser produced by the laser source 101 to the resonance frequency of the resonator 103. As known to one having skill in the art, injection locking occurs when a first oscillator, producing a laser at a first frequency (a launch frequency), is disturbed by a second laser at a second frequency, where the second frequency is close to the first frequency. When the first and second frequencies are close enough to one another, the second laser may capture the first laser such that the frequencies of the first laser and the second laser become essentially identical. With regards to the system 100, the output laser provided by the resonator 103 at the resonance frequency of the resonator 103 may capture the laser produced by the laser source 101 such that the laser produced by the laser source 101 is substantially equivalent to the resonance frequency of the resonator 103.

Figure 1B:
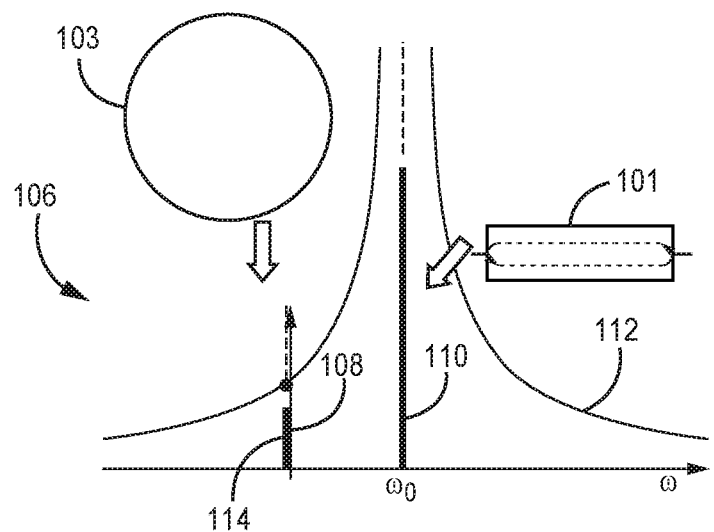
FIG. 1B is a graph illustrating the effects of injection locking a frequency of a laser using a resonator according to an aspect of the present disclosure.

FIG. 1B is a graph 106 illustrating the effects of injection locking within the system 100. Without external feedback, the laser source 101 may produce a laser at frequency ($\omega_0$) because the longitudinal mode 110 may have a higher gain than other produced modes. As shown, the laser source 101 may produce laser light having various frequency components along the gain curve 112 when the overall gain is equal to the loss. As the resonance frequency 114 is within the frequencies having a substantive component within the gain curve 112, a portion of the laser light emitted by the laser source 101 may resonate within the resonator 103. Thus, the resonator 103 may provide an output laser at the resonance frequency 114 back to the laser source 101. Accordingly, the laser produced by the laser source 101 may have higher overall gain near frequency 114 than the original laser frequency 110 due to the external feedback near frequency 114. Thus, the laser produced by the laser source 101 may begin to lase at a frequency close to the resonance frequency instead of the frequency 110. In certain embodiments, the output laser at the resonance frequency 114 may perturb the laser provided by the laser source 101 such that the launch frequency of the laser source 101 moves from the initial frequency 110 towards an injection locked frequency 108. As shown, the injection locked frequency 108 is substantially equal to the resonance frequency 114. Thus, the laser source 101 may provide a laser at a frequency that is locked to the resonance frequency 114 of the resonator 103.

Figure 2:
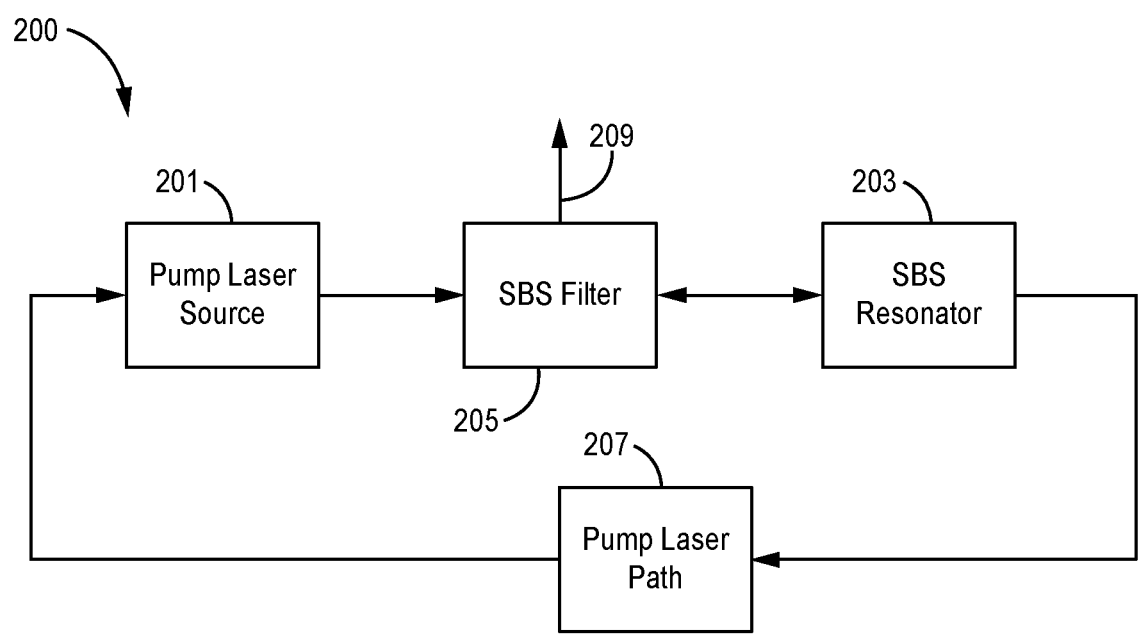
FIG. 2 is a block diagram illustrating an exemplary system for providing a self-injection locked stimulated Brillouin scattering laser according to an aspect of the present disclosure.

FIG. 2 is a block diagram of a system 200 for providing an SBS laser through the implementation of an injection-locked pump laser. As shown, the system 200 may include a pump laser source 201. The pump laser source 201 may be any laser source capable of providing a laser at a desired frequency. For example, the pump laser source 201 may be an electrically pumped gain medium, a DFB laser, a DBR laser, a ring laser, or other type of laser-providing device. The pump laser source 201 may be coupled to an SBS filter 205, wherein the SBS filter 205 merely passes the received pump laser through to a transmission port of the SBS filter 205.

In certain embodiments, the system 200 may include an SBS resonator 203. In some implementations, after receiving the pump laser from the pump laser source 201, the SBS filter 205 may couple the received pump laser into the SBS resonator 203. A portion of the pump laser may propagate within the SBS resonator 203 at a particular resonance frequency of the SBS resonator 203. For example, as discussed above with respect to FIGS. 1A-1B, the pump laser may have light at a range of frequencies along a gain curve, where one or more of the resonance frequencies of the SBS resonator 203 are within the range of frequencies. The portions of the light of the pump laser at one of the resonance frequencies may propagate within the SBS resonator 203. Portions of the pump laser that are off resonance of the SBS resonator 203 may fail to propagate within the SBS resonator 203.

In some embodiments, the system 200 may include a pump laser path 207, where the pump laser path 207 routes an output of the SBS resonator 203 to an input of the pump laser source 201. For example, the SBS resonator 203 may provide the portion of the pump laser that is at the resonance frequency of the SBS resonator 203 to the pump laser path 207. The pump laser path 207 may then couple the resonant portion of the pump laser to an input of the pump laser source 201. As the resonant frequency of the pump laser is near the resonant frequency of the SBS resonator 203 external feedback provided by the SBS resonator 203 may cause the frequency of the pump laser to lock to the resonance frequency of the SBS resonator 203 due to effects of injection locking as described above with respect to FIGS. 1A and 1B.

In further embodiments, to couple the output of the SBS resonator 203 to the pump laser source 201, the pump laser path 207 may provide an optical path that couples an output from the SBS resonator 203 to the pump laser source 201. The optical path may include an optical fiber, waveguide, mirrors that reflect the light through free space, or other optical transmission medium. Alternatively, the SBS resonator 203 or the pump laser path 207 may reflect the pump laser through the original input of the SBS resonator 203. The back-reflected pump beam may then be provided back to the transmission port of the SBS filter 205, where the SBS filter 205 passes the back-reflected pump beam through to the pump laser source 201 as an external feedback, where the back-reflected pump beam may then cause the frequency of the pump laser provided by the pump laser source 201 to lock to the resonance frequency of the SBS resonator 203 in accordance with the effects of injection locking described above with respect to FIGS. 1A and 1B.

In certain embodiments, when the pump laser propagates in a particular direction within the SBS resonator 203, a SBS laser may propagate in an opposite direction within the SBS resonator 203 due to stimulated Brillouin scattering. The generated laser may be provided as an output from the SBS resonator 203 that is coupled into the SBS filter 205. When the SBS filter 205 receives an SBS laser at the stimulated Brillouin scattering frequency, the SBS filter 205 may couple the SBS laser to a drop port of the SBS filter 205. The drop port of the SBS filter 205 may be coupled to an SBS output 209 of the system 200. The SBS output 209 may provide the SBS laser to other devices coupled to the system 200 or to other components within a larger system that encompasses the system 200.

As described above, by using injection locking of the pump laser source 201, the different components within the system 200 may be fabricated within a single integrated photonics chip. In particular, the use of injection locking within the system 200 may allow the system 200 to lock the frequency of the pump laser produced by the pump laser source 201 to the resonance frequency of the SBS resonator 203 without implementing control loops having components that prevent the integration of the system 200 on a single integrated photonics chip. While the various components of the system 200 may be implemented within a single integrated photonics chip, the components of the system 200 may also be comprised of separate components or groups of components that are coupled to one another through combinations of optical transmission media that may include fiber optics, optical waveguides, reflectors, and/or free space optical transmissions.

Figure 3:
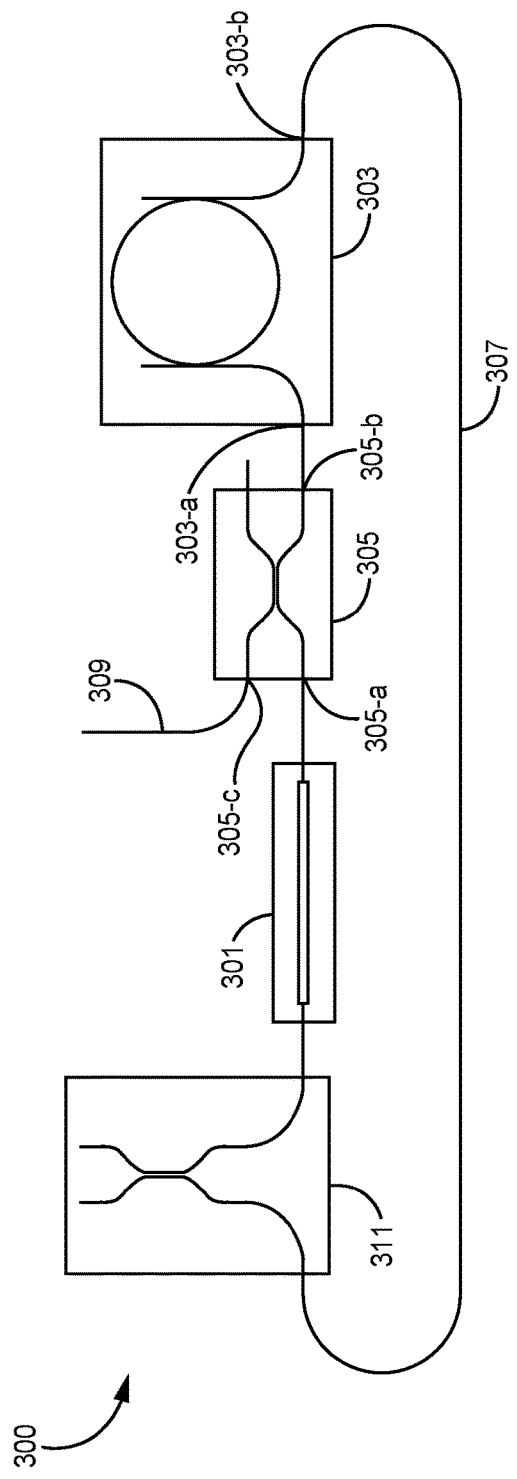
FIG. 3 is a block diagram illustrating an exemplary system for providing a self-injection locked stimulated Brillouin scattering laser according to an aspect of the present disclosure.

FIG. 3 is a block diagram illustrating a system 300 for producing an SBS laser using an injection locked pump laser. In particular, the system 300 may be a detailed implementation of the system 200. For example, the system 300 includes a pump laser source 301, an SBS filter 305, an SBS resonator 303, and a pump laser path 307 that function in a substantially similar manner to the pump laser source 201, the SBS filter 205, the SBS resonator 203, and the pump laser path 207 described above in FIG. 2.

In certain embodiments, the pump laser source 301 provides a pump laser substantially as described above in connection with the pump laser source 201 in FIG. 2. The pump laser source 301 may be coupled to an input transmission port 305-a of an SBS filter 305. As illustrated, the SBS filter 305 may be an optical add/drop filter. For example, the SBS filter 305 may include coupled optical waveguides having Bragg gratings formed therein. When light propagates through an input, the light may be coupled from one waveguide to the other based on the frequency of the light. With regards to the pump laser, when the SBS filter 305 receives a laser through the input port 305-a at the frequency of the pump laser or near the resonance frequency of the SBS resonator 303, the SBS filter 305 may keep the pump laser within the same waveguide and couple the pump laser to the output port 305-b.

In some embodiments, the output port 305-b may be coupled to an input port 303-a of the SBS resonator 303. As described above in FIG. 2, components of the pump laser at one or more of the resonance frequencies of the SBS resonator 303 may propagate within the SBS resonator 303. Accordingly, the SBS resonator 303 may provide components of the pump laser at one or more of the resonance frequencies of the SBS resonator 303 through the output port 303-b.

In certain embodiments, the system 300 may include a pump laser filter 311 that is positioned between the SBS resonator 303 and the pump laser source 301. In particular, the output port 303-b of the SBS resonator 303 may be coupled to a pump laser filter 311 to attenuate undesired components of the pump laser that are at resonance frequencies of the SBS resonator 303 other than the resonance frequency of the SBS resonator 303 that incites the generation of the desired SBS laser. For example, the frequency range of the light produced by the pump laser source 301 may span multiple resonance frequencies of the SBS resonator 303. Accordingly, the SBS resonator 303 may provide multiple optical beams associated with different resonance frequencies of the SBS resonator 303 through the output port 303-b. To ensure that the pump laser produced by the pump laser source 301 locks to the correct resonance frequency, the pump laser filter 311 may be a bandpass filter that passes a single resonance frequency associated with the desired SBS laser frequency and attenuate the light at other resonance frequencies. Accordingly, the pump laser will lock to the desired resonance frequency.

As described above, when the pump laser propagates within the SBS resonator 303, an SBS laser may be generated within the SBS resonator 303. The SBS laser may propagate in an opposite direction from the direction of propagation of the pump laser within the SBS resonator 303. For example, the pump laser enters the SBS resonator 303 at port 303-a, may propagate in a clockwise direction within the SBS resonator 303, and is coupled out of the SBS resonator 303 at port 303-b. Conversely, the SBS laser may be generated to propagate in the counter-clockwise direction within the SBS resonator 303 and coupled out of the SBS resonator 303 at port 303-a. While the terms "clockwise" and "counter-clockwise" are used herein to indicate a direction of propagation within the SBS resonator 303, the terms are used to indicate that the SBS laser and the pump laser propagate in opposite directions within the SBS resonator 303.

In certain embodiments, when the SBS laser is coupled out of the port 303-a from the SBS resonator 303, the system 300 may couple the SBS laser into the SBS filter 305. As described above, in relation to the pump laser, the SBS filter 305 may pass optical beams at the frequency of the pump laser through the SBS filter 305 without coupling the pump laser from one waveguide to another. However, the SBS filter 305 may couple optical beams at the frequency of the SBS laser from one waveguide to another. For example, the SBS filter 305 may receive the SBS laser on port 305-b and couple the SBS laser into another waveguide such that the SBS laser is coupled out of the SBS filter 305 at port 305-c. The port 305-c may then be coupled to an SBS laser output port 309 for the system 300.

Figure 4:
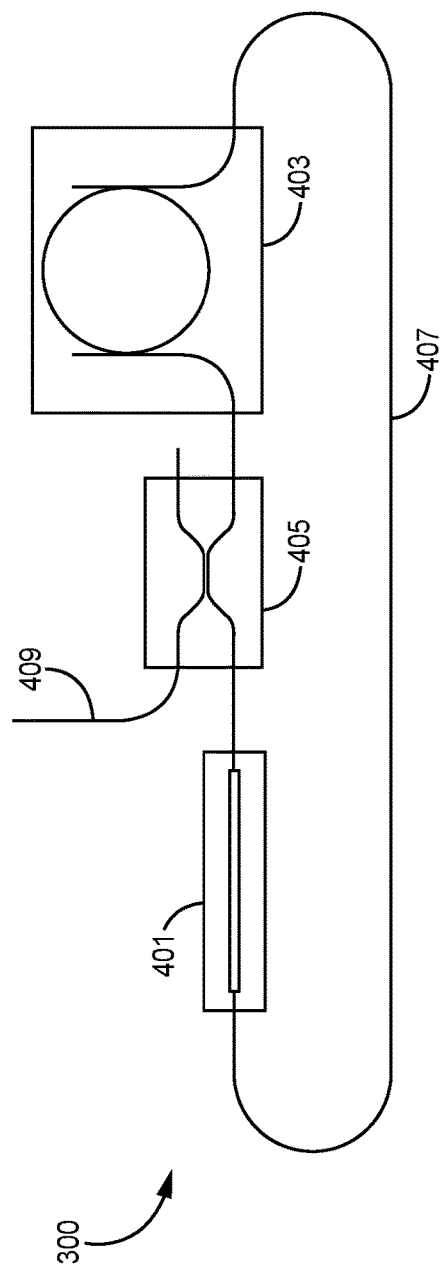
FIG. 4 is a block diagram illustrating an exemplary system for providing a self-injection locked stimulated Brillouin scattering laser according to an aspect of the present disclosure.

FIG. 4 is a block diagram illustrating an additional system 400 for producing an SBS laser using an injection locked pump laser. The system 400 is largely similar to the system 300. For example, the pump laser source 401, the SBS filter 405, the SBS resonator 403, the SBS laser output port 409, and the pump laser path 407 function substantially as described above with respect to the pump laser source 301, SBS filter 305, SBS resonator 303, SBS laser output port 309, and pump laser path 307 in FIG. 3. However, the system 400 is different from the system 300 in that the system 400 may not include a pump laser filter, such as the pump laser filter 311 in FIG. 3.

In some embodiments, the pump laser source 301 may be able to produce laser light at a narrow range of frequencies. In particular, the range of frequencies may be narrow enough to include a single resonance frequency of the SBS resonator 403. When the range of frequencies includes a single resonance frequency, when the pump laser is returned along the pump laser path 407 from the SBS resonator 403, the returned pump laser may be a narrow laser at a single resonance frequency. As the returned pump laser includes a single resonance frequency, the system 400 may operate without a pump laser filter used to eliminate unwanted signals at different resonance frequencies of the SBS resonator 403 that are not associated with the creation of the SBS laser.

Figure 5:
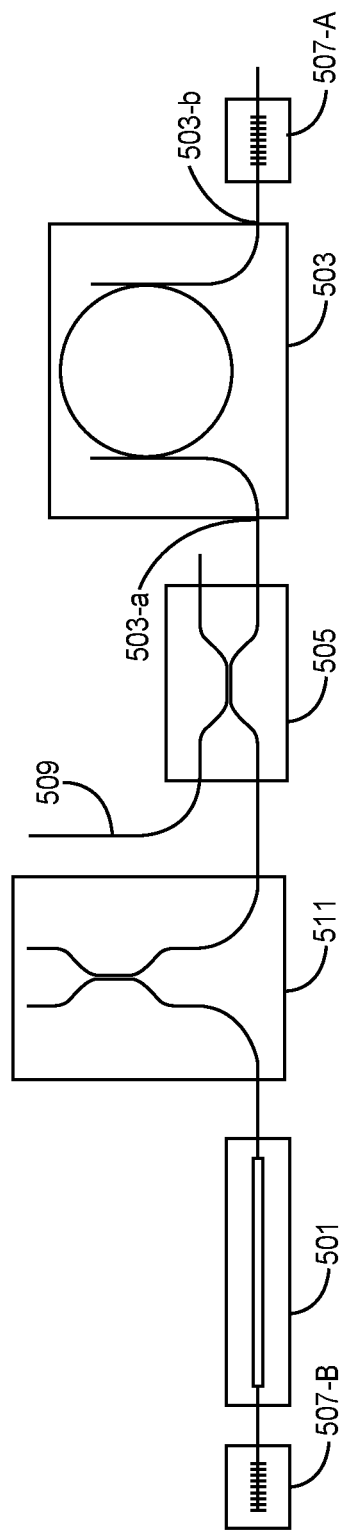
FIG. 5 is a block diagram illustrating an exemplary system for providing a self-injection locked stimulated Brillouin scattering laser according to an aspect of the present disclosure.

FIG. 5 is a block diagram illustrating an additional system 500 for producing an SBS laser using an injection locked pump laser. The system 500 is similar to the system 300. For example, the pump laser source 501, the SBS filter 505, the SBS resonator 503, the SBS laser output port 509, and the pump laser filter 511 function substantially as described above with respect to the pump laser source 301, the SBS filter 305, the SBS resonator 303, the SBS laser output port 309, and the pump laser filter 311 in FIG. 3. However, the system 500 is different from the system 300 in that the mechanism for the pump laser path uses reflector 507-a to direct the pump laser to an input of the pump laser source 501.

In certain embodiments, when the pump laser beam enters the SBS resonator 503, the pump laser may be coupled out of the SBS resonator 503 at the output port 503-b. The output port 503-b may be coupled to a reflector 507-A. The reflector 507-a may be a partial reflector or full reflector. Additionally, the reflector 507-a may also be coupled to the output port 503-a of the SBS resonator 503 such that a portion of the pump laser is reflected back into the SBS resonator 503. The portion of the pump laser that is reflected back into the SBS resonator 503 may be coupled out of the SBS resonator 503 into the SBS filter 505, coupled through the pump laser filter 511, positioned between the SBS filter 505 and the pump laser source 501, and into the pump laser source 501, where the reflected pump laser locks the frequency of pump laser to a resonance frequency of the SBS resonator 503.

Figure 6:
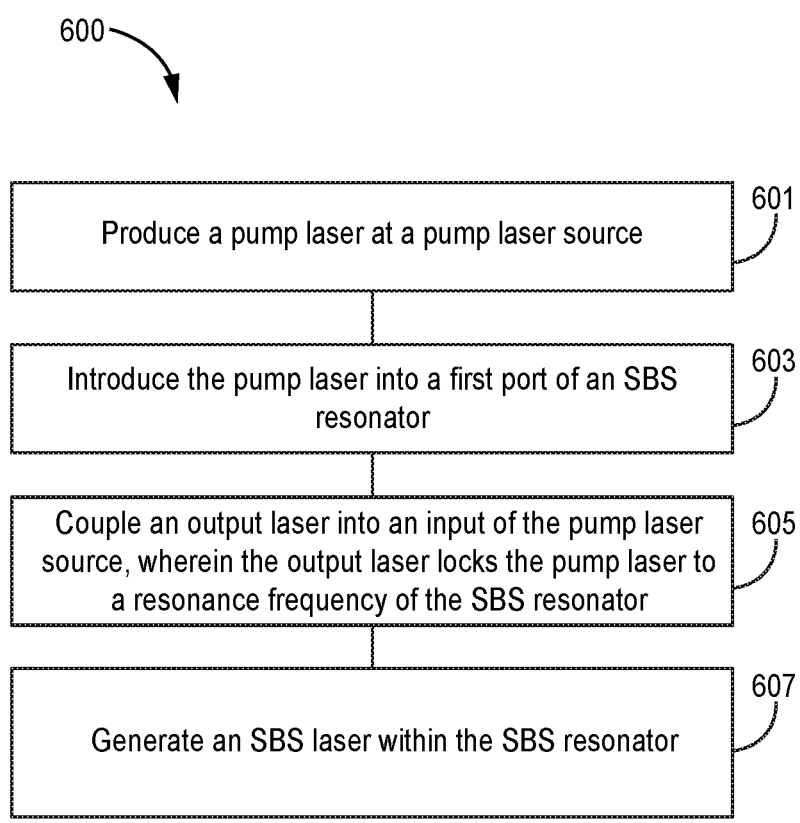
FIG. 6 is a flow chart diagram illustrating an exemplary method for providing a self-injection locked stimulated Brillouin scattering laser according to an aspect of the present disclosure.

FIG. 6 is a flowchart diagram of a method 600 for providing a self-injection locked SBS laser. As shown, the method 600 proceeds at 601, where a pump laser is produced at a pump laser source. Additionally, the method 600 proceeds at 603, where the pump laser is introduced into a first port of an SBS resonator. Further, the method 600 proceeds at 605, where a resonator output is coupled back into the pump laser source, wherein the output laser locks the pump laser to a resonance frequency of the SBS resonator. Moreover, the method 600 proceeds at 607, where an SBS laser is generated within the SBS resonator. For example, the Brillouin scattering of the pump laser within the SBS resonator may create an SBS laser that propagates in the opposite direction of the propagation direction of the pump laser.

EXAMPLE EMBODIMENTS

Example 1 includes a system comprising: a pump laser source that provides a pump laser; a stimulated Brillouin scattering (SBS) resonator that receives the pump laser through a first port, wherein the SBS resonator scatters a portion of the pump laser to provide an SBS laser through the first port, and wherein a frequency shift of Brillouin scattering within the SBS resonator is an integer multiple of a free-spectral range for the SBS resonator; a filter that receives the pump laser on a first filter port and the SBS laser on a second filter port, wherein the pump laser is output through the second filter port and the SBS laser is output through a drop port; and a pump laser path that couples the output pump laser from the SBS resonator into the pump laser source, wherein a frequency of the pump laser becomes locked to a frequency of the output pump laser at a resonance frequency of the SBS resonator.

Example 2 includes the system of Example 1, wherein the pump laser path comprises an optical path that couples a transmission port of the SBS resonator to the pump laser source.

Example 3 includes the system of Example 2, further comprising a pump laser filter coupled in the optical path between the SBS resonator and the pump laser source.

Example 4 includes the system of any of Examples 1-3, wherein the pump laser path comprises: a mirror that reflects the output pump laser back into a transmission port of the SBS resonator, wherein the output pump laser propagates from the first port of the SBS resonator, through the filter and the pump laser source; and a second mirror that reflects the output pump laser back into the pump laser source after the output pump laser has passed through the pump laser source.

Example 5 includes the system of Example 4, further comprising a pump laser filter positioned between the filter and the pump laser source, wherein the pump laser filter attenuates components of the output pump laser at undesired resonance frequencies of the SBS resonator.

Example 6 includes the system of any of Examples 1-5, wherein the pump laser source provides a range of frequencies that includes a single resonance frequency of the SBS resonator.

Example 7 includes the system of any of Examples 1-6, wherein the pump laser source, the filter, and the SBS resonator are fabricated on an integrated photonics chip.

Example 8 includes a method comprising: producing a pump laser at a pump laser source; introducing the pump laser into a first port of a stimulated Brillouin scattering (SBS) resonator; coupling an output laser into the pump laser source, wherein the output laser is provided from a second port of the SBS resonator at a resonance frequency of the SBS resonator and the output laser locks the pump laser to the resonance frequency of the SBS resonator; and generating an SBS laser within the SBS resonator.

Example 9 includes the method of Example 8, wherein coupling the output laser into the input of the pump laser source comprises coupling an optical transmission medium between the SBS resonator and the input of the pump laser source.

Example 10 includes the method of Example 9, further comprising filtering the pump laser source between the SBS resonator and the pump laser source to attenuate components of the output laser at undesired resonance frequencies.

Example 11 includes the method of any of Examples 8-10, wherein coupling the output laser into the input of the pump laser source comprises: reflecting the output laser back into the second port of the SBS resonator, wherein the output laser propagates from the first port of the SBS resonator and through the pump laser source; and reflecting the output pump laser back into the pump laser source after the output pump laser has passed through the pump laser source.

Example 12 includes the method of Example 11, further comprising filtering the pump laser source between the SBS resonator and the pump laser source to attenuate components of the output laser at undesired resonance frequencies of the SBS resonator.

Example 13 includes the method of any of Examples 8-12, wherein producing the pump laser comprises producing a laser having a frequency range that includes a single resonance frequency of the SBS resonator.

Example 14 includes the method of any of Examples 8-13, further comprising forming the pump laser source and the SBS resonator on an integrated photonics chip.

Example 15 includes the method of Example 14, further comprising coupling the SBS laser off of the integrated photonics chip.

Example 16 includes the method of Example 15, wherein coupling the SBS laser off of the integrated photonics chip comprises passing the SBS laser through an SBS filter that couples the SBS laser off of the integrated photonics chip through a drop port.

Example 17 includes a system comprising: a stimulated Brillouin scattering (SBS) resonator that provides an SBS laser through a first port of the SBS resonator in response to light propagating within the resonator; a pump laser source that provides a pump laser that is coupled into the SBS resonator through the first port and an output pump laser is coupled out of the SBS resonator through a second port of the SBS resonator; and a pump laser path that couples the output pump laser from the second port of the SBS resonator into an input of the pump laser source, wherein a frequency of the pump laser locks to a resonance frequency of the SBS resonator.

Example 18 includes the system of Example 17, further comprising a filter that receives the pump laser on a first filter port and the SBS laser on a second filter port, wherein the pump laser is output through the second filter port and the SBS laser is output through a drop port.

Example 19 includes the system of any of Examples 17-18, wherein the pump laser path comprises an optical path that couples the second port of the SBS resonator to the input of the pump laser source.

Example 20 includes the system of any of Examples 17-19, wherein the pump laser path comprises: a mirror that reflects the output pump laser back into the second port of the SBS resonator, wherein the output pump laser propagates from the first port of the SBS resonator and through the pump laser source; and a second mirror that reflects the output pump laser back into the pump laser source after the output pump laser has passed through the pump laser source.

Although specific embodiments have been illustrated and described herein, it will be appreciated by those of ordinary skill in the art that any arrangement, which is calculated to achieve the same purpose, may be substituted for the specific embodiments shown. Therefore, it is manifestly intended that this invention be limited only by the claims and the equivalents thereof

What is claimed is:

1. A system comprising:
   a pump laser source that provides a pump laser;
   a stimulated Brillouin scattering (SBS) resonator that receives the pump laser through a first port, wherein the SBS resonator scatters a portion of the pump laser to provide an SBS laser through the first port, and wherein a frequency shift of Brillouin scattering within the SBS resonator is an integer multiple of a free-spectral range for the SBS resonator;
   a filter that receives the pump laser on a first filter port and the SBS laser on a second filter port, wherein the pump laser is output through the second filter port as an output pump laser and the SBS laser is output through a drop port; and
   a pump laser path that couples the output pump laser from the SBS resonator into the pump laser source, wherein a frequency of the pump laser becomes locked to a frequency of the output pump laser at a resonance frequency of the SBS resonator;
   wherein the pump laser path comprises an optical path that couples a transmission port of the SBS resonator to the pump laser source, wherein a pump laser filter is coupled in the pump laser path between the SBS resonator and the pump laser source such that light from the transmission port is first coupled to the pump laser filter and then to the pump laser source, wherein the pump laser filter is arranged to ensure that the pump laser produced by the pump laser source locks to the correct resonance frequency.

2. The system of claim 1, wherein the pump laser path comprises:
   a mirror that reflects the output pump laser back into a transmission port of the SBS resonator, wherein the output pump laser propagates from the first port of the SBS resonator, through the filter and the pump laser source; and
   a second mirror that reflects the output pump laser back into the pump laser source after the output pump laser has passed through the pump laser source.

3. The system of claim 2, further comprising a pump laser filter positioned between the filter and the pump laser source, wherein the pump laser filter attenuates components of the output pump laser at undesired resonance frequencies of the SBS resonator.

4. The system of claim 1, wherein the pump laser source provides a range of frequencies that includes a single resonance frequency of the SBS resonator.

5. The system of claim 1, wherein the pump laser source, the filter, and the SBS resonator are fabricated on an integrated photonics chip.

6. A method comprising:
   producing a pump laser at a pump laser source;
   introducing the pump laser into a first port of a stimulated Brillouin scattering (SBS) resonator;
   coupling an output laser into the pump laser source, wherein the output laser is provided from a second port of the SBS resonator at a resonance frequency of the SBS resonator and the output laser locks the pump laser to the resonance frequency of the SBS resonator; and
   generating an SBS laser within the SBS resonator;
   coupling an optical transmission medium between the SBS resonator and the input of the pump laser source; and
   filtering the light from the SBS resonator for providing to the pump laser source to attenuate components of the output laser at undesired resonance frequencies, wherein filtering is to ensure that the pump laser produced by the pump laser source locks to the correct resonant frequency.

7. The method of claim 6, wherein coupling the output laser into the input of the pump laser source comprises:
   reflecting the output laser back into the second port of the SBS resonator, wherein the output laser propagates from the first port of the SBS resonator and through the pump laser source; and
   reflecting the output pump laser back into the pump laser source after the output pump laser has passed through the pump laser source.

8. The method of claim 7, further comprising filtering the pump laser source between the SBS resonator and the pump laser source to attenuate components of the output laser at undesired resonance frequencies of the SBS resonator.

9. The method of claim 6, wherein producing the pump laser comprises producing a laser having a frequency range that includes a single resonance frequency of the SBS resonator.

10. The method of claim 6, further comprising forming the pump laser source and the SBS resonator on an integrated photonics chip.

11. The method of claim 10, further comprising coupling the SBS laser off of the integrated photonics chip.

12. The method of claim 11, wherein coupling the SBS laser off of the integrated photonics chip comprises passing the SBS laser through an SBS filter that couples the SBS laser off of the integrated photonics chip through a drop port.

13. A system comprising:
a stimulated Brillouin scattering (SBS) resonator that provides an SBS laser through a first port of the SBS resonator in response to light propagating within the resonator;
a pump laser source that provides a pump laser that is coupled into the SBS resonator through the first port and an output pump laser is coupled out of the SBS resonator through a second port of the SBS resonator; and
a pump laser path that couples the output pump laser from the second port of the SBS resonator into an input of the pump laser source, wherein a frequency of the pump laser locks to a resonance frequency of the SBS resonator, wherein the pump laser path comprises:
a mirror that reflects the output pump laser back into the second port of the SBS resonator, wherein the output pump laser propagates from the first port of the SBS resonator and through the pump laser source; and
a second mirror that reflects the output pump laser back into the pump laser source after the output pump laser has passed through the pump laser source.

14. The system of claim 13, further comprising a filter that receives the pump laser on a first filter port and the SBS laser on a second filter port, wherein the pump laser is output through the second filter port and the SBS laser is output through a drop port.

* * * * *